(12) United States Patent
Wang et al.

(10) Patent No.: US 10,006,471 B2
(45) Date of Patent: Jun. 26, 2018

(54) FAN MODULE AND ELECTRONIC DEVICE USING THE SAME

(71) Applicant: Acer Incorporated, New Taipei (TW)

(72) Inventors: Yung-Chih Wang, New Taipei (TW);
Cheng-Wen Hsieh, New Taipei (TW);
Kuang-Hua Lin, New Taipei (TW);
Cheng-Yu Cheng, New Taipei (TW);
Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days. days.

(21) Appl. No.: 15/352,212

(22) Filed: Nov. 15, 2016

(65) Prior Publication Data

US 2018/0051717 A1 Feb. 22, 2018

(30) Foreign Application Priority Data

Aug. 22, 2016 (TW) .............................. 105126794 A
Aug. 22, 2016 (TW) .............................. 105126808 A (51) Int. Cl.
| | | |
|---|---|---|
| *G06F 1/20* | (2006.01) | |
| *F04D 29/42* | (2006.01) | |
| *H05K 7/20* | (2006.01) | |
| *F04D 29/66* | (2006.01) | |
| *F04D 29/28* | (2006.01) | |

(52) U.S. Cl.
CPC ......... *F04D 29/666* (2013.01); *F04D 29/281* (2013.01); *F04D 29/4226* (2013.01); *F04D 29/4233* (2013.01); *G06F 1/203* (2013.01); *H05K 7/20145* (2013.01); *H05K 7/20172* (2013.01)

(58) Field of Classification Search
CPC ... G06F 1/203; F04D 29/4226; F04D 29/4233
See application file for complete search history.

(56) References Cited

U.S. PATENT DOCUMENTS

| | | | | |
|---|---|---|---|---|
| 4,761,115 | A * | 8/1988 | Hopfensperger | ..... F04D 29/663 |
| | | | | 415/119 |
| 5,584,339 | A * | 12/1996 | Hong | ..... H01L 23/467 |
| | | | | 165/122 |
| 5,867,365 | A | 2/1999 | Chiou | |
| 5,879,141 | A | 3/1999 | Yokozawa et al. | |
| 6,030,286 | A | 2/2000 | Kameoka et al. | |
| 6,139,265 | A * | 10/2000 | Alizadeh | ............... F04D 29/544 |
| | | | | 415/208.1 |

(Continued)

FOREIGN PATENT DOCUMENTS

| | | |
|---|---|---|
| CN | 202673781 | 1/2013 |
| CN | 104074774 | 10/2014 |

(Continued)

*Primary Examiner* — Adrian S Wilson
(74) *Attorney, Agent, or Firm* — J.C. Patents (57) ABSTRACT

A fan module and an electronic device using the fan module are provided. The fan module includes a housing, a fan blade assembly, and a fan hub. The housing has a first surface on which plural wind guiding structures are arranged. The fan blade assembly is pivoted to the housing through the fan hub and adapted to rotate along a rotation direction. The wind guiding structures are arranged along a circumferential direction of the fan hub to guide a wind flow into the housing while the fan blade assembly is being rotated.

20 Claims, 9 Drawing Sheets

(56) References Cited

U.S. PATENT DOCUMENTS

| | | | | |
|---|---|---|---|---|
| 6,311,767 | B1* | 11/2001 | Inoue | F28D 15/0275 165/104.33 |
| 6,664,673 | B2* | 12/2003 | Lopatinsky | F04D 25/0653 257/E23.099 |
| 7,071,587 | B2* | 7/2006 | Lopatinsky | F04D 17/04 257/E23.099 |
| 7,255,532 | B2* | 8/2007 | Zheng | F04D 17/04 415/183 |
| 8,405,990 | B2* | 3/2013 | Senoh | F04D 29/582 361/695 |
| 2003/0017048 | A1* | 1/2003 | Lin | F04D 29/30 415/206 |
| 2003/0219339 | A1 | 11/2003 | Huang et al. | |
| 2005/0095120 | A1 | 5/2005 | Takamatsu | |
| 2005/0207886 | A1* | 9/2005 | Chen | F01D 1/02 415/206 |
| 2006/0024160 | A1* | 2/2006 | Horng | F04D 29/4226 415/206 |
| 2006/0078427 | A1* | 4/2006 | Hsieh | F04D 25/0613 415/206 |
| 2006/0152900 | A1 | 7/2006 | Nishi et al. | |
| 2007/0222331 | A1* | 9/2007 | Horng | F04D 27/004 310/268 |
| 2007/0251677 | A1 | 11/2007 | Hwang et al. | |
| 2008/0180913 | A1* | 7/2008 | Kaneko | G06F 1/203 361/697 |
| 2009/0290307 | A1* | 11/2009 | Hwang | F04D 17/16 361/695 |
| 2010/0080719 | A1* | 4/2010 | Boggess, Jr. | F04D 29/526 417/423.14 |
| 2011/0194930 | A1 | 8/2011 | Ai et al. | |
| 2012/0121407 | A1 | 5/2012 | Yamashita | |
| 2013/0039751 | A1* | 2/2013 | Tseng | F04D 29/663 415/206 |
| 2014/0010681 | A1 | 1/2014 | Wang | |
| 2014/0154067 | A1 | 6/2014 | Shih et al. | |
| 2014/0293539 | A1* | 10/2014 | Jia | F04D 29/4226 361/695 |
| 2015/0300368 | A1 | 10/2015 | Hsu | |
| 2015/0337857 | A1 | 11/2015 | Lu et al. | |
| 2015/0354595 | A1 | 12/2015 | Su et al. | |

FOREIGN PATENT DOCUMENTS

| | | |
|---|---|---|
| DE | 102015112148 | 2/2016 |
| EP | 2463745 | 6/2012 |
| JP | 2001041198 | 2/2001 |
| TW | 201135068 | 10/2011 |
| WO | 2009011350 | 1/2009 |
| WO | 2016121046 | 8/2016 |

* cited by examiner

FAN MODULE AND ELECTRONIC DEVICE USING THE SAME

CROSS-REFERENCE TO RELATED APPLICATION

This application claims the priority benefit of Taiwan application serial no. 105126794, filed on Aug. 22, 2016, and Taiwan application serial no. 105126808, filed on Aug. 22, 2016. The entirety of each of the above-mentioned patent applications is hereby incorporated by reference herein and made a part of this specification.

Field of the Invention

The invention relates to a module and a device; more particularly, the invention relates to a fan module and an electronic device using the fan module.

Description of Related Art

Fans are heat dissipation devices that are widely used and are effective. The fans are operated according to active heat dissipation technologies. Specifically, the wind inlet of a normal fan is designed to allow an air flow to enter from a fan hub opening located on a fan hub and in the center of a fan module. Therefore, the air flow is vertically absorbed into the fan from the fan hub opening and is then pushed by some rotating fan blades close to the fan hub, such that the direction of the air flow is forcibly changed.

Figure 1A:
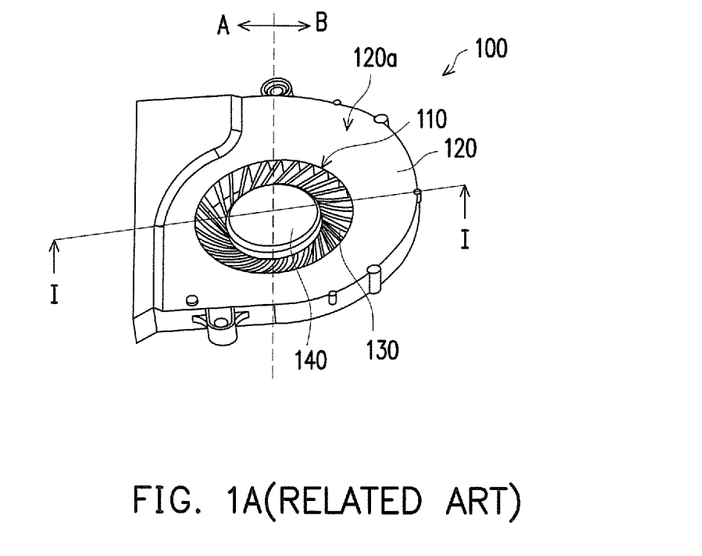
FIG. 1A is a schematic view illustrating a conventional fan module.
Figure 1B:
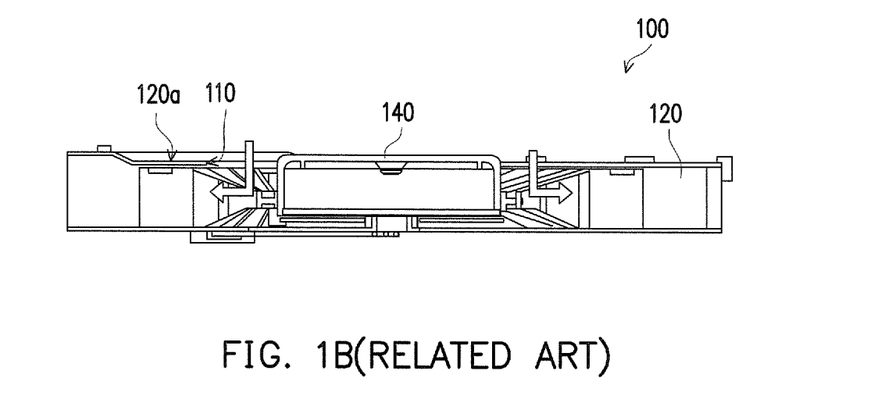
FIG. 1B is a schematic cross-sectional view of the fan module taken along a section line I-I in FIG. 1A.

FIG. 1A is a schematic view illustrating a conventional fan module, and FIG. 1B is a schematic cross-sectional view of the fan module taken along a section line I-I in FIG. 1A. With reference to FIG. 1A and FIG. 1B, as provided above, the air flow is vertically absorbed into a fan module 100 from a fan hub opening 110; however, after the air flow is continuously measured and simulated by people skilled in the pertinent art, it can be learned that the quantity of the incoming air flow on the left-half of the fan module 100 is greater than the quantity of the incoming air flow on the right-half of the fan module 100, and air leakage occurs on the right-half of the fan module 100. Hence, the fan module 100 is divided into the left air entry area and the right air leakage area. Designers do not expect the formation of the air leakage area which poses a negative impact on the overall heat dissipation effects of the fan module.

Besides, after the air flow vertically absorbed into the fan module enters the housing 120, the rotation of the blades 130 forcibly changes the direction of the air flow, such that the air flows along the rotation direction of the blades 130. Moreover, the air may flow in an outward direction along the profile of the blades from an area close to a fan hub 140 to an area away from the fan hub 140. During the process, the air is squeezed and touches the blades 130 and the housing 120 of the fan module, whereby noise is generated. As such, the overall operation of the electronic device having the fan module 100 is impaired.

SUMMARY OF THE INVENTION

The invention provides a fan module with low noise and favorable heat dissipation effects.

The invention provides an electronic device with improved heat dissipation performance.

In an embodiment of the invention, a fan module includes a housing, a fan blade assembly, and a fan hub. The housing has a first surface on which plural wind guiding structures are arranged. The fan blade assembly is pivoted to the housing through the fan hub and adapted to rotate along a rotation direction. The wind guiding structures are arranged along a circumferential direction of the fan hub to guide a wind flow into the housing while the fan blade assembly is being rotated.

According to an embodiment of the invention, the wind guiding structures are arranged along a circumferential direction and disposed around at least one portion of the fan hub in a radiating manner.

According to an embodiment of the invention, orthogonal projections of the wind guiding structures on a bottom of the housing are located within an orthogonal projection of the fan blade assembly on the bottom of the housing.

According to an embodiment of the invention, the first surface has a fan hub opening where the fan hub is located, and a diameter of the fan hub opening is greater than a diameter of the fan hub.

According to an embodiment of the invention, wherein the wind guiding structures are protruding wind stopping openings, and each of the protruding wind stopping openings faces toward an upstream side of the rotation direction.

According to an embodiment of the invention, each of the protruding wind stopping openings has a wind stopper and a wind inlet, and the wind stopper protrudes from the first surface and is adjacent to the wind inlet. Along the rotation direction, for each of the protruding wind stopping openings, the wind inlet is located at the upstream side, and the wind stopper is located at a downstream side. Each of the wind stoppers has a connection portion and a parallel portion parallel to the first surface, and the connection portion is connected between the parallel portion and the first surface. The wind inlets are of a rectangular shape or an arc shape along a radial direction of the fan hub.

According to an embodiment of the invention, the wind guiding structures are recessed wind pressing openings; along the rotation direction, each of the recessed wind pressing openings is recessed toward the inside of the housing from the first surface.

According to an embodiment of the invention, the first surface has a wind entry area and a sealed area, the recessed wind pressing openings are arranged in the wind entry area, and the sealed area is sealed.

According to an embodiment of the invention, the recessed wind pressing openings include fixed blades and wind inlets, and the fixed blades are recessed toward the inside of the housing from the first surface.

According to an embodiment of the invention, the fan module further includes a plurality of protruding wind stopping openings disposed corresponding to the wind inlets of the recessed wind pressing openings. Each of the protruding wind stopping openings has a wind stopper, and the wind stoppers and the recessed wind pressing openings are located at two sides of a corresponding one of the wind inlets and share the corresponding one of the wind inlets. Each of the wind stoppers has a connection portion and a parallel portion parallel to the first surface, and the connection portion is connected between the parallel portion and the first surface. The wind inlets are of a rectangular shape or an arc shape along a radial direction of the fan hub.

According to an embodiment of the invention, the first surface has a fan hub opening, the fan hub is located in the fan hub opening, and the housing further has an extension portion covering and sealing the fan hub opening.

According to an embodiment of the invention, the fan blade assembly includes a rotation axis and blades, the fan hub and the rotation axis are fixed to each other, the blades are radially connected to the rotation axis along a circumference of the rotation axis, and each of the blades is of a rectangular shape.

In an embodiment of the invention, an electronic device includes a chassis and any of the aforesaid fan modules installed in the chassis.

According to an embodiment of the invention, the electronic device further includes a display electrically connected to the chassis.

In view of the above, the fan module provided herein has the improved performance and reduced noise during operation. Besides, the electronic device using the fan module has favorable efficiency in heat dissipation and thus has long service life.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

In an embodiment of the invention, an innovative fan module is provided, wherein the structural improvement of the original components of the fan module leads to noise reduction, improved quantity of input air, and increased wind pressure, so as to improve the performance of the fan module and further ensure the operation of the electronic device having the fan module. Moreover, the electronic device using the fan module has favorable efficiency in heat dissipation and thus has long service life. Details of the electronic device and its fan module are explained hereinafter.

Figure 2:
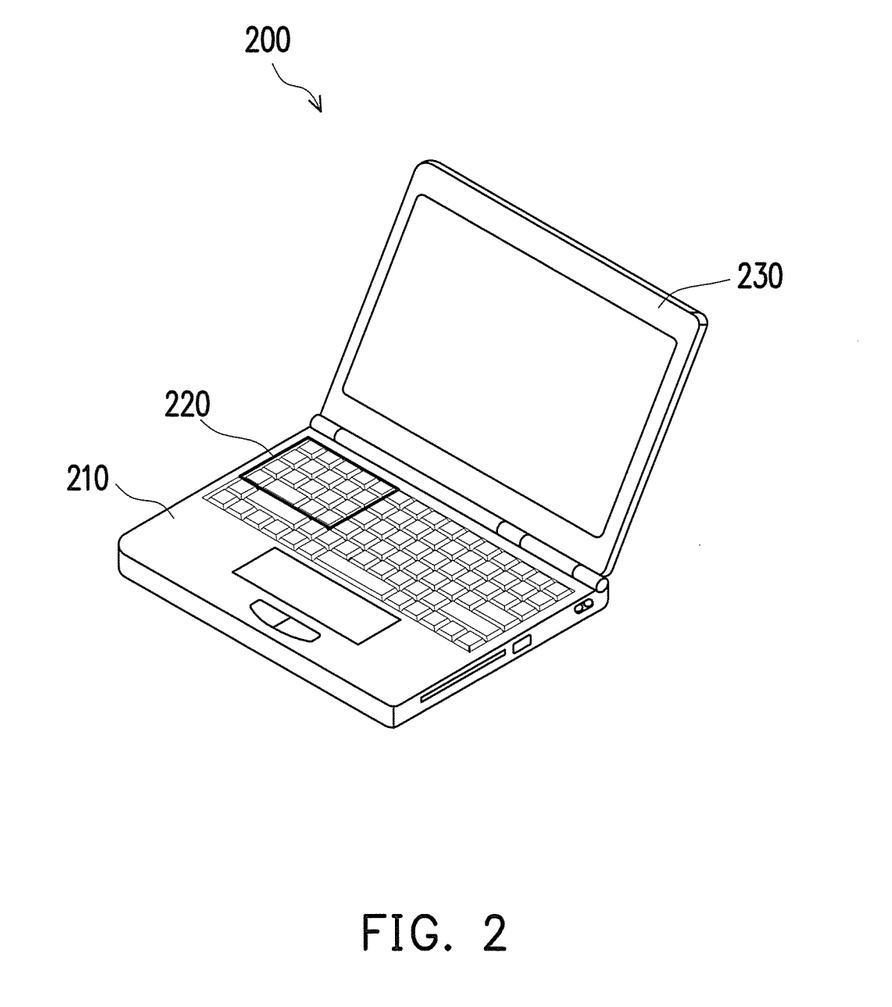
FIG. 2 is a schematic view illustrating an electronic device.

FIG. 2 is a schematic view illustrating an electronic device. With reference to FIG. 2, the electronic device 200 provided in the present embodiment is a notebook computer, while the electronic device 200 may also be a desktop computer, an all-in-one computer, a tablet, and so on. The electronic device 200 includes a chassis 210 and a fan module 220 installed in the chassis 210. The chassis 210 is a host of the notebook computer but may also be a host of the desktop computer or a host of the all-in-one computer. The electronic device 200 may further include a display 230 electrically connected to the chassis 210, and the display 230 displays data processed by a central processing system in the chassis 210 in form of images, texts, or the like. Peripheral accessories including printers, keyboards, mice, and earphones may be optionally arranged according to actual needs.

Figure 3A:
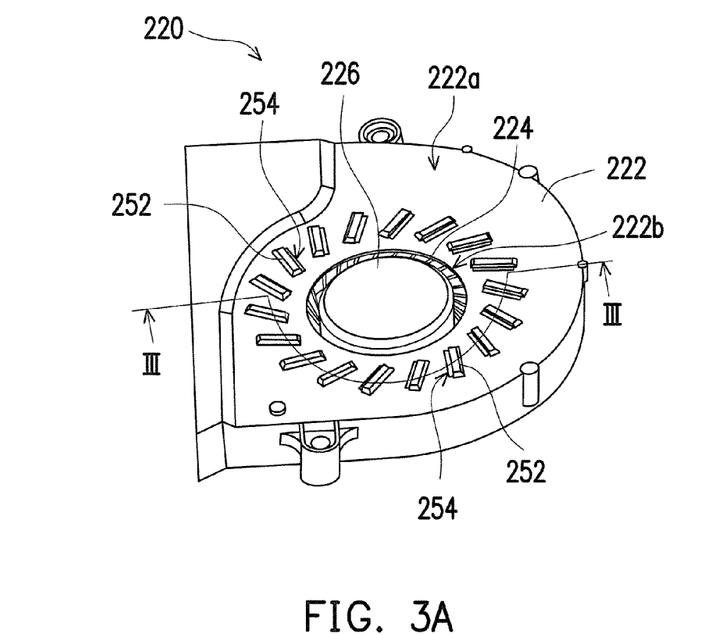
FIG. 3A is a schematic three-dimensional view illustrating a fan module.

FIG. 3A is a schematic three-dimensional view illustrating a fan module. Please refer to FIG. 2 and FIG. 3A. A fan module 220 installed in the chassis 210 of the electronic device 200 includes a housing 222, a fan blade assembly 224 (as shown in FIG. 3C), and a fan hub 226. The housing 222 is made of metal, for instance. In consideration of structural rigidity and the overall weight of the electronic device, the housing 222 may be made of metal with high rigidity and light weight. Certainly, plastic may also be applied to make the housing 222 based on other considerations. The housing 222 has a first surface 222a, and plural wind guiding structures configured to achieve multiple purposes are arranged on the first surface 222a. The fan blade assembly 224 may be made of metal or plastic. Here, the fan blade assembly 224 and the fan hub 226 may be individual components and are assembled together and fixed to each other; alternatively, the 224 and the fan hub 226 may be integrally formed in the same manufacturing step. The fan blade assembly 224 is installed in the housing 222 through the fan hub 226 and is rotated with respect to the fan hub 226 as a rotation axis. The wind guiding structures are arranged along the circumferential direction of the fan hub 226 in a radiating manner, so as to guide the wind flow into the housing 222 during the operation of the fan blade assembly 224. Specifically, the wind guiding structures are extended from the proximity of the fan hub opening 222b on the first surface 222a of the housing or from the fan hub 226 to a direction away from the fan hub opening 222b or a direction away from the fan hub 226, and the fan hub opening 222b will be elaborated hereinafter. It can be learned from the top view of the wind guiding structures that the shape of the wind guiding structures is similar to the shape of the fan blade assembly 224.

The fan blade assembly 224 includes a rotation axis 224a and blades 224b. The fan hub 226 and the rotation axis 224a are fixed to each other, and the blades 224b are radially connected to the rotation axis 224a along the circumference of the rotation axis 224a. The rotation axis 224a is connected to a power source (not shown); therefore, when the power source supplies power, the rotation axis 224a is driven to be rotated, and the blades 224b are then driven to be rotated. The wind guiding structures of the fan module 220 provided herein contribute to noise reduction, improved quantity of input air, and increased wind pressure, such that the performance of the fan module 220 provided herein can be improved. Various embodiments are provided hereinafter to describe different ways to implement the wind guiding structures and the resultant effects.

First Embodiment

Figure 3B:
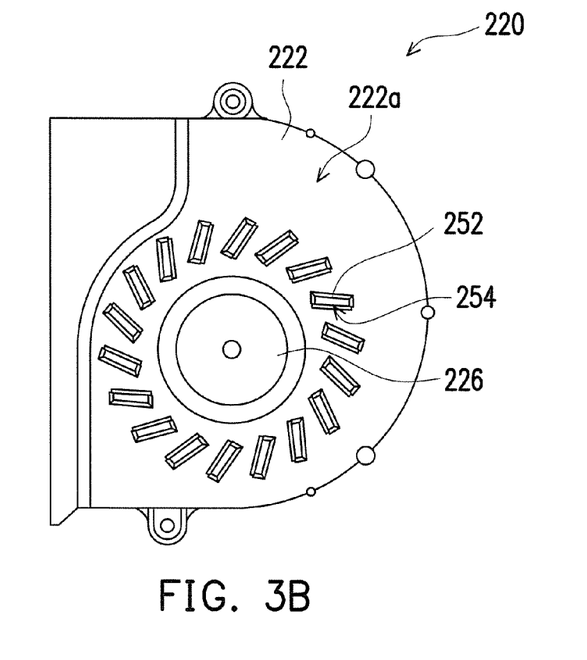
FIG. 3B is a top view of FIG. 3A.
Figure 3C:
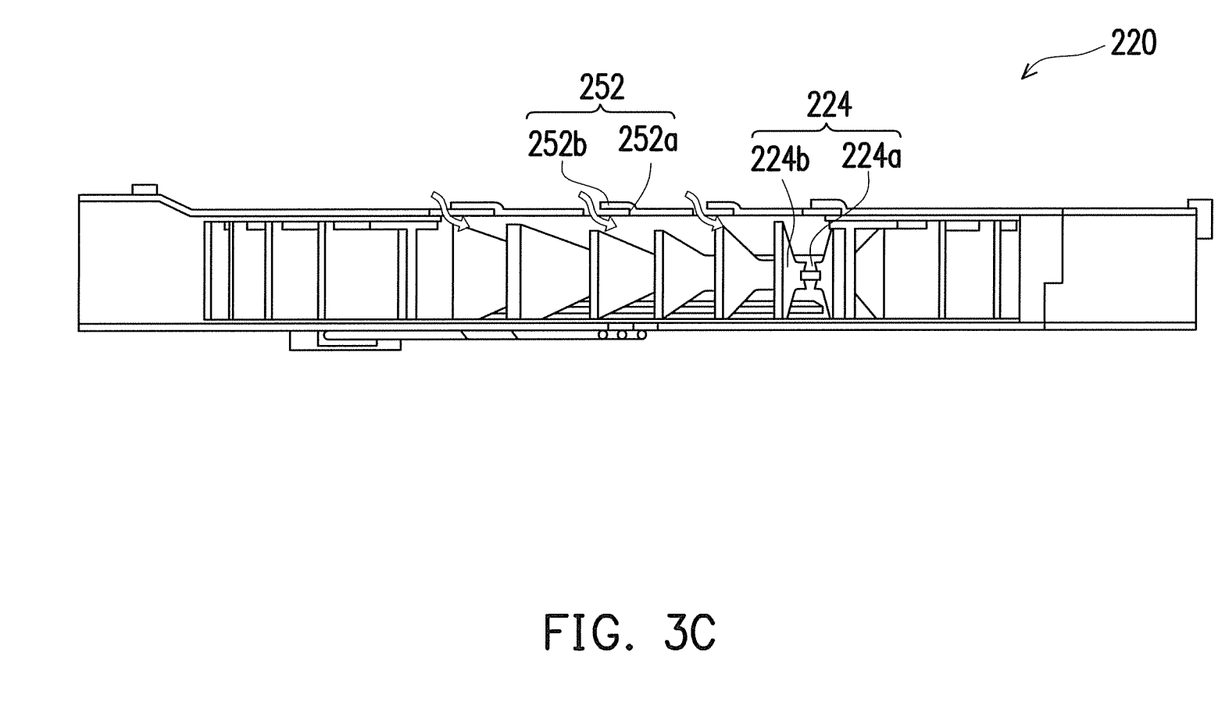
FIG. 3C is a schematic view taken along a section line III-III in FIG. 3A.

FIG. 3B is a top view of FIG. 3A, and FIG. 3C is a schematic view taken along a section line III-III in FIG. 3A. With reference to FIG. 3A, FIG. 3B, and FIG. 3C, in the first embodiment, the wind guiding structures are protruding wind stopping openings (not labeled). Each of the protruding wind stopping openings (not labeled) has a wind inlet 254 and a wind stopper 252 that is formed by punching the housing 222 made of metal, for instance, and the wind stoppers 252 protrude from the first surface 222a and allow wind to enter the wind inlets 254. Besides, along the rotation direction of the fan blade assembly 224, the wind inlets 254 are located at the upstream side, and the wind stoppers 252 are located at the downstream side, such that the wind stoppers 252 may well block and capture the wind flow. Specifically, if the fan blade assembly 224 is set to rotate in a counterclockwise direction, each wind inlet 254 is located in front of the wind stopper 252 along the counterclockwise direction; by contrast, if the fan blade assembly 224 is set to rotate in a clockwise direction, each wind inlet 254 is located in front of the wind stopper 252 along the clockwise direction.

Figure 4:
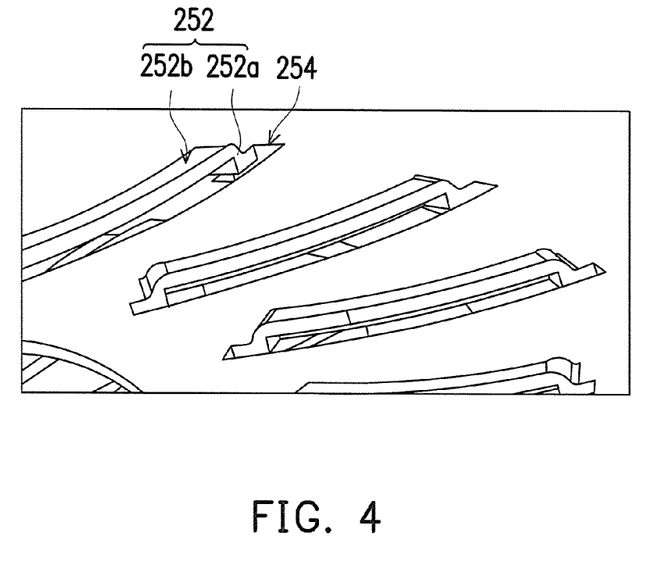
FIG. 4 is a schematic partial view illustrating the fan module in FIG. 3A.
Figure 5:
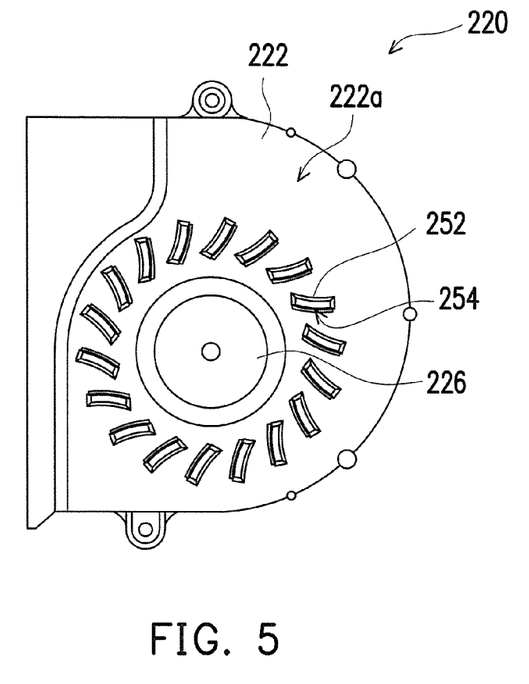
FIG. 5 is a schematic view illustrating another implementation type of wind inlets and wind stoppers.

FIG. 4 is a schematic partial view illustrating the fan module in FIG. 3A. With reference to FIG. 3A, FIG. 3C, and FIG. 4, the wind stoppers 252 are shaped as a soccer goal; parts of the wind stoppers 252 connected to the wind inlets 254 are opened, and the other parts of the wind stoppers 252 not connected to the wind inlets 254 are closed. As shown in FIG. 3C and FIG. 4, each of the wind stoppers 252 has a connection portion 252a and a parallel portion 252b parallel to the first surface 222a, and the connection portions 252a are connected between the parallel portions 252b and the first surface 222a. That is, the cross-sections of the wind stoppers 252 and the first surface 222a is substantially shaped as a reversed letter S. The connection portions 252a may be inclined with respect to the first surface 222a or perpendicular to the first surface 222a. Along the radial direction of the fan hub 226, the wind inlets 254 are of the rectangular shape, and the shape of the wind stoppers 252 is changed together with the shape of the wind inlets 254. As shown in FIG. 3B, when the fan module 220 is observed from the top, and when the wind inlets 254 are of the rectangular shape, the wind stoppers 252 are of the rectangular shape; when the wind inlets 254 are of the arc shape (as shown in FIG. 5), the wind stoppers 252 are of the arc shape (as shown in FIG. 5) as well. Whenever the wind inlets 254 are of the rectangular shape or the arc shape, the wind inlets 254 have the length direction. Here, the wind inlets 254 may be inclined in its length direction with respect to the radial direction of the fan hub 226 and may be arranged in a radiating manner; certainly, the wind inlets 254 may also be arranged in a radiating manner in its length direction parallel to the radial direction of the fan hub 226.

It should be mentioned that the fan module 220 provided in the present embodiment and the conventional fan module 100 may have the same structure, i.e., the first surface 222a of the housing 222 has the fan hub opening 222b, and the fan hub 226 is located in the fan hub opening 222b. Here, the diameter of the fan hub opening 222b is greater than the diameter of the fan hub 226. That is, a gap is between edges of the fan hub 226 and the fan hub opening 222b, and wind flows into the housing 222 through the gap.

When the fan blade assembly 224 is rotated with respect to the rotation axis 224a as the center of rotation, the wind is input not only through the gap between the edges of the fan hub 226 and the fan hub opening 222b but also through the protruding wind stopping openings. Compared to the quantity of wind input to the conventional fan module 100, the quantity of wind input to the fan module 220 provided in the present embodiment is increased, such that the heat dissipation performance of the fan module 220 can be enhanced.

In particular, when the fan blade assembly 224 is being rotated (e.g., in a counterclockwise direction), the wind is driven to enter the housing 222 through the wind inlets 254. The wind stoppers 252 protruding from the first surface 222a are located at the front end of the wind flow. Due to the soccer-goal-like shape of the wind stoppers 252, the wind stoppers 252 can effectively capture the wind flow and prevent the wind from escaping. Besides, the wind stoppers 252 are designed to block the wind generated by the rotation of the fan blade assembly 224; hence, air that is likely to escape from the blades 224b is blocked by the wind stoppers 252 and brought back to the inside of the housing 222, so as to reduce wind leakage.

While the wind flows into the housing 222 because of the rotation of the fan blade assembly 224, the profile of the wind stoppers 252 also contributes to the guidance of the wind flow. As shown in FIG. 3C and FIG. 5, the wind may flow into the housing 222 in an inclined manner along the profile of the wind stoppers 252, and the wind is then pushed by the fan blade assembly 224 along the rotation direction of the blades 224b, moved from an area close to the center to an area close to the edge of the fan blade assembly 224, and output. In the conventional fan module 100, the wind flows into the conventional fan module 100 in a direction perpendicular to the first surface 120a. Hence, if the direction of the wind flow is forcibly changed by the fan blade assembly 224 after the wind flow enters the housing 222, the housing 222 and the fan blade assembly 224 are vibrated, whereby noise is generated. By contrast, the wind guided by the profile of the wind stoppers 252 touches the fan blade assembly 224 smoothly, and the friction of the wind flow applied on the housing 222 and the fan blade assembly 224 is reduced. As a result, the wind can be easily driven by the fan blade assembly 224, and noise can be effectively reduced.

Figure 6A:
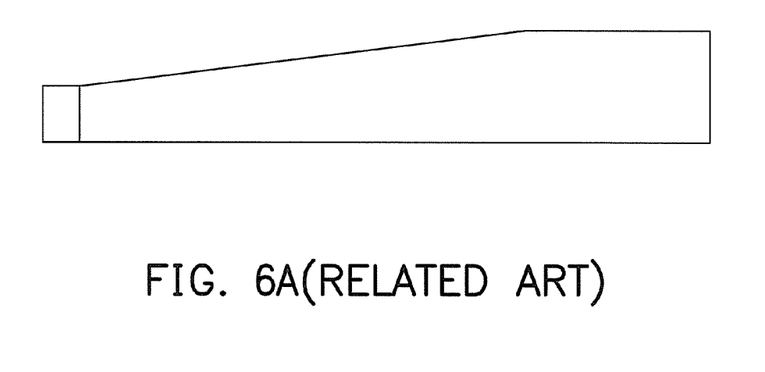
FIG. 6A is a schematic view illustrating shape of blades in a conventional fan module.
Figure 6B:
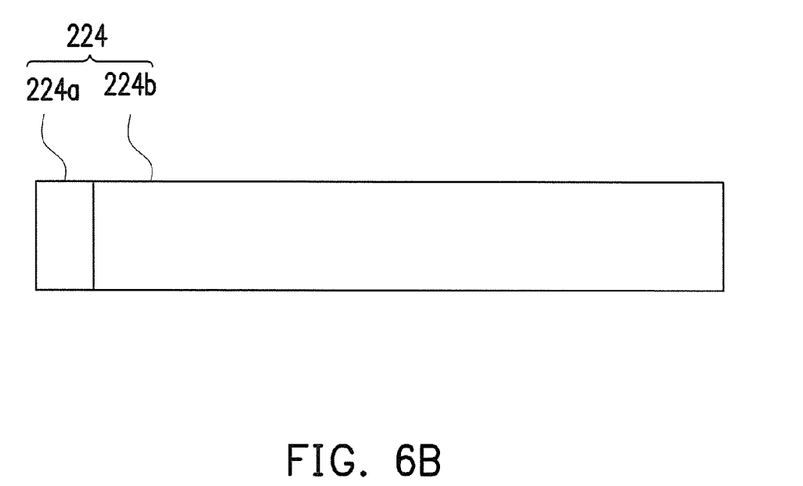
FIG. 6B is a schematic view illustrating shape of blades in a fan module according to a first embodiment of the invention.

Note that the wind vertically enters the conventional fan module 100 through the wind hub opening 110. Hence, each of the blades cannot be designed of a rectangular shape, wherein an area occupied by portions of the blades close to the fan hub 140 is smaller than an area occupied by other portions of the blades away from the fan hub 140 (as shown in FIG. 6A), such that the air is allowed to easily enter the housing 120 through the fan hub opening 110. By contrast, the fan module 220 provided in the present embodiment has protruding wind stopping openings on the first surface 222a, and wind does not enter the fan module 220 merely through the fan hub opening 222b. Accordingly, each of the blades can be designed to be of a rectangular shape, which means that an area occupied by ends of the blades 222b connected to the rotation axis 224a can be the same as an area occupied by other ends of the blades 222b away from the rotation axis 224a (as shown in FIG. 6B), and therefore, the total area occupied by the blades 224b as provided herein is greater than the total area occupied by the blades in the conventional fan module 100. In comparison with the quantity of air pushed by the blades in the conventional fan module 100, the quantity of air pushed by the blades in the fan module 220 is increased, and the performance of the fan module 220 is indirectly improved.

In addition, given that the quantity of air entering the conventional fan module 100 (whose fan hub opening 110 has a relatively large diameter) and the quantity of air entering the fan module provided herein are the same, the fan hub opening 222b may be designed to have a relatively small diameter. Due to the arrangement of the protruding wind stopping openings, the wind entry paths are increased, such that the quantity of air entering the fan module provided herein can be the same as the quantity of air entering the conventional fan module. Besides, if the diameter of the fan hub opening 222b is relatively small, it indicates that the holes on the housing 222 are relatively small, and thus the structural strength of the housing 222 is relatively large.

Note that the protruding wind stopping openings are arranged within the fan blade assembly 224. Specifically, orthogonal projections of the protruding wind stopping openings on a bottom of the housing 222 are located within an orthogonal projection of the fan blade assembly 224 on the bottom of the housing 222. Since the rotation of the fan blade assembly 224 results in forced convection, an area within the fan blade assembly 224 is significantly affected by the forced convection and thus has strong wind, and an area not within the fan blade assembly 224 is not significantly affected by the forced convection and thus has weak wind. In this case, if the protruding wind stopping openings are located in the area with the weak wind, air may leak from the protruding wind stopping openings.

In light of the foregoing, the protruding wind stopping openings are arranged on the first surface 222a of the housing 222 in the fan module 220 provided in the present embodiment. Thereby, the quantity of air entering the housing 222 is increased, the performance of the fan module 220 is improved, and the electronic device 220 using the fan module 220 can operate smoothly and have long service life. Moreover, the way in which the protruding wind stopping openings guide the wind to enter the housing 222 and the wind is pushed by the fan blade assembly 224 forwardly both contribute to the reduction of noise of the fan module 220.

Second Embodiment

Figure 7A:
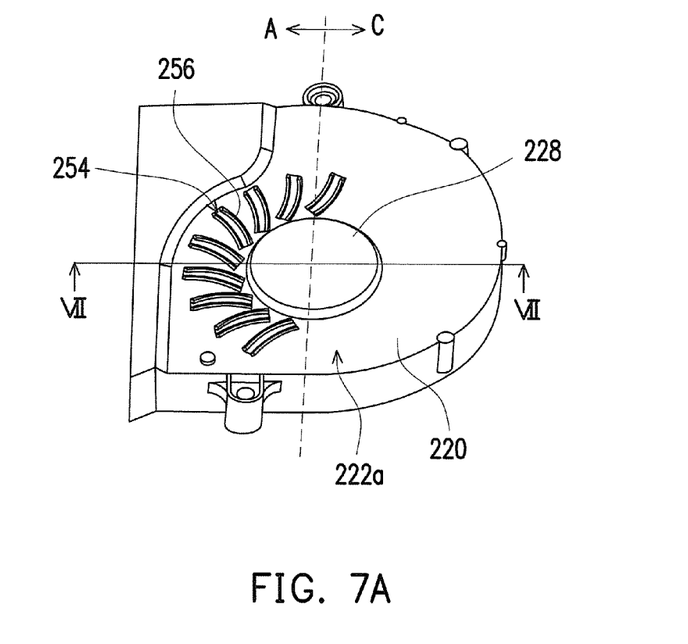
FIG. 7A is a schematic three-dimensional view illustrating a fan module according to a second embodiment of the invention.
Figure 7B:
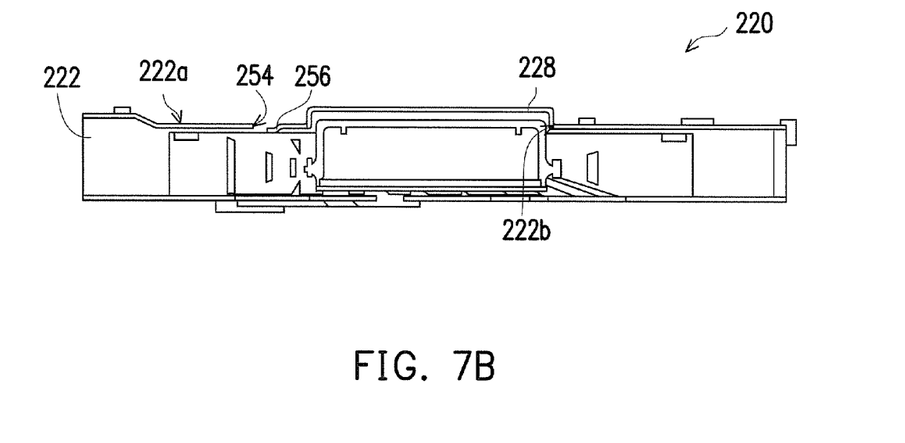
FIG. 7B is a schematic view taken along a section line VII-VII in FIG. 7A.

FIG. 7A is a schematic three-dimensional view illustrating a fan module according to a second embodiment of the invention; FIG. 7B is a schematic view taken along a section line VII-VII in FIG. 7A. With reference to FIG. 3A, FIG. 3C, FIG. 7A, and FIG. 7B, the structure of the fan module provided in the present embodiment is similar to that given in the previous embodiment, while the improvement provided herein lies in that the wind guiding structures described in the present embodiment are recessed wind pressing openings arranged on the first surface 222a, and the recessed wind pressing openings are recessed toward the inside of the housing 222. The recessed wind pressing openings are arranged along a circumferential direction of at least one portion of the fan hub 226 in a radiating manner and are arranged accordingly within the projection range of the fan blade assembly 224. Through the disposition of the recessed wind pressing openings, the fan hub 226 can further cover the fan hub opening 222b, so as to seal the fan hub opening 222b.

Particularly, the wind guiding structures provided in the present embodiment are combinations of fixed blades and wind inlets 254, and the fixed blades are recessed from the first surface 222a.

Figure 8A:
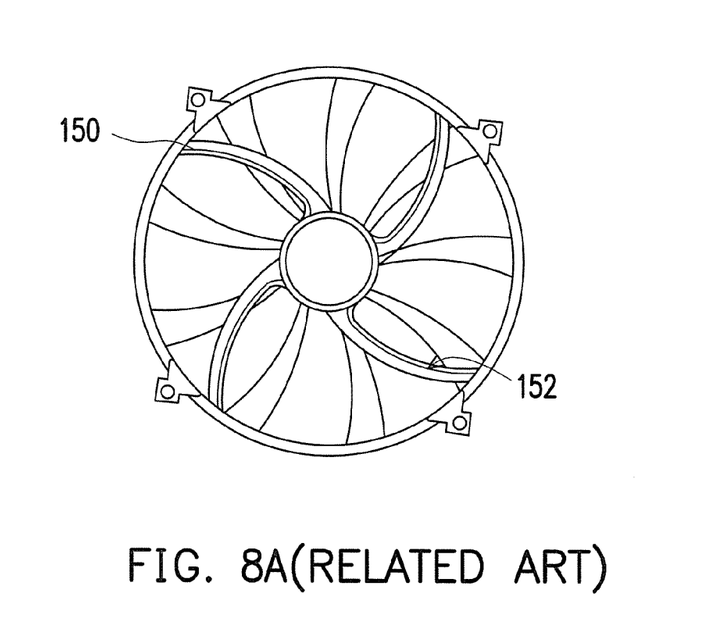
FIG. 8A and FIG. 8B are schematic views illustrating fixed blades on a fan frame in a conventional fan module.
Figure 8B:
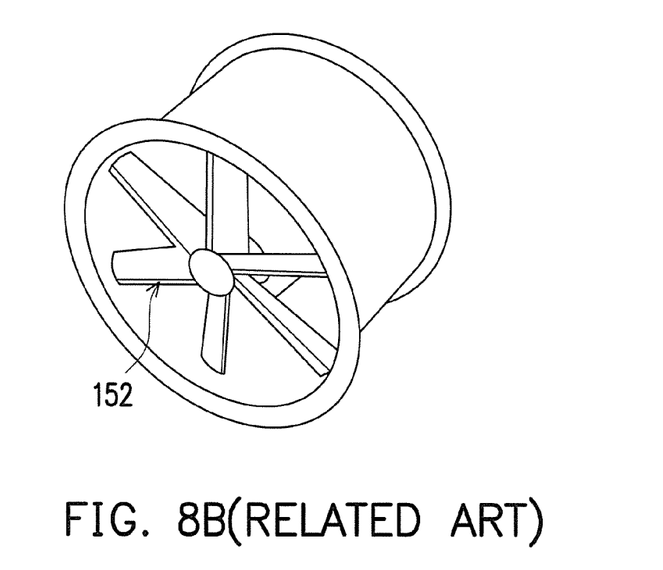

In the conventional fan module 100, the fixed blades 152 are arranged on a fan frame 150 or on blades (as shown in FIG. 8A and FIG. 8B), so as to adjust the P-Q curve of the fan module 100. Thereby, the high quantity of input wind can be adjusted to high pressure of the input wind, and the fan module 100 characterized by the high pressure of the input wind can be adapted to systems with unfavorable wind entry conditions or large resistance. By contrast, in the present embodiment, the fixed blades 256 are located on the first surface 222a of the housing 222 and are adjacent to the wind inlets 254; hence, the functions achieved by arranging the fixed blades 152 on the fan frame 150 or on the blades in the conventional fan module 100 can also be accomplished in the fan module provided in the present embodiment, and air guided into the wind inlets 254 can be pressurized.

It should be mentioned that wind entry and wind leakage simultaneously occur at the fan hub opening 110 on the first surface 120a of the housing 120 of the conventional fan module 100, and thus the first surface 120a is divided into a wind entry area A and a wind leakage area B; in the present embodiment, however, the recessed fixed blades 256 arranged on the first surface 222a lead to high pressure of the input wind. To enhance the heat dissipation effects resulting from the high pressure of the input wind, the recessed wind pressing openings are arranged at the wind entry area A, and the original wind leakage area B can be sealed to form a sealed area C and prevent wind leakage.

Similarly, to further prevent wind leakage, the housing 222 may further have an extension portion 228 covering and sealing the fan hub opening 222b.

Since the fan hub 226 further covers the fan hub opening 222b, the housing 222 of the fan module 220 has a complete structure, and the strength of the housing 222 provided in the present embodiment is greater than the strength of the housing 222 described in the first embodiment. During a keyboard pressing test, the housing 220 can protect the fan module 220 from being squeezed and from generating abnormal sound. Hence, the gap between the keyboard and the fan module 220 can be reduced, and so can the overall thickness of the electronic device 200 be reduced.

Besides, the fixed blades 256 and the wind inlets 254 are arranged along the rotation direction of the blades 224b, i.e., along the rotation direction of the fan blade assembly 224, and the fixed blades 256 are located in front of the wind inlets 254. Therefore, the wind can enter the housing 222 in a forward direction and is then pressurized by the blades 224b passing through the wind and by the stationary housing 222. In the present embodiment, the wind entry location is different from that in the conventional fan module 100 (i.e., wind enters the conventional fan module 100 through the fan hub opening 110). Hence, the design of the blades 224b can be the same as that provided in the first embodiment, which means that each of the blades is of a rectangular shape and the area occupied by ends of the blades 224b connected to the rotation axis 224a can be the same as an area occupied by other ends of the blades 224b away from the rotation axis 224a (as shown in FIG. 6B). Through the increase in the area occupied by the wind flow pushed by the blades 224b, the overall performance of the fan module 220 is enhanced.

Third Embodiment

Figure 9A:
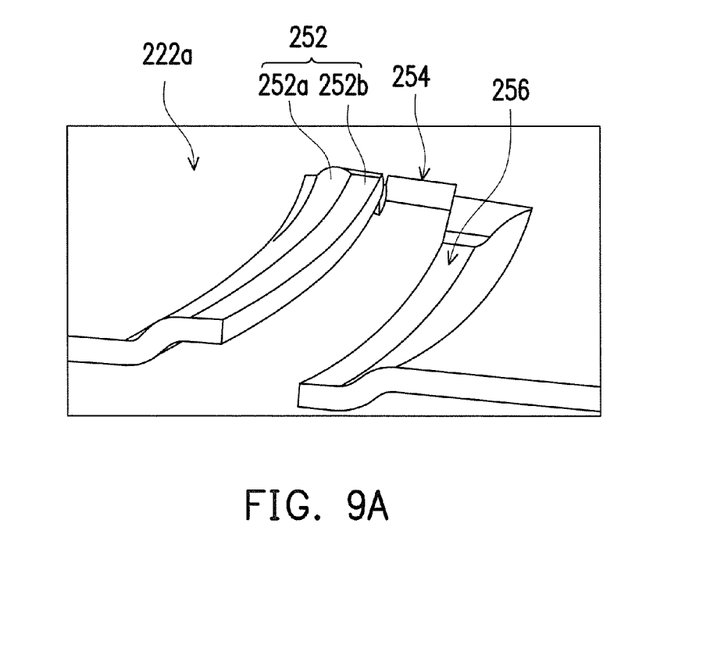
FIG. 9A is a schematic partial view illustrating a fan module according to a third embodiment of the invention.
Figure 9B:
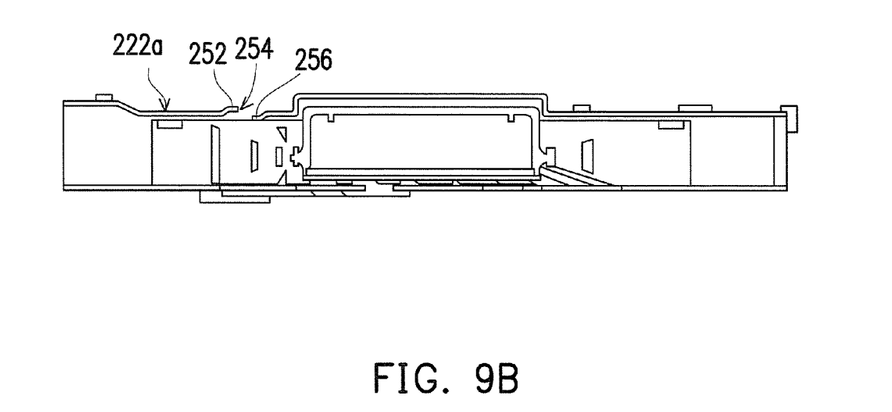
FIG. 9B is a cross-sectional view illustrating the fan module according to the third embodiment of the invention.

FIG. 9A is a schematic three-dimensional view illustrating a fan module according to a third embodiment of the invention; FIG. 9B is a cross-sectional view of the fan module according to the third embodiment. With reference to FIG. 7B, FIG. 9A, and FIG. 9B, the difference between the present embodiment and the second embodiment lies in that a wind stopper 252 and a fixed blade 256 sharing one wind inlet 254 are arranged on the first surface 222a. That is, the wind stopper 252 and the fixed blade 256 are located at two opposite sides of one wind inlet 254. Along the rotation direction of the fan blade assembly 244, each wind guiding structure includes the fixed blade 256, the wind inlet 254, and the wind stopper 252 in order.

When the fan blade assembly 224 (shown in FIG. 3C) is rotated, the wind stoppers 252 protruding from the first surface 222a can capture the wind flow, so as to prevent wind leakage, guide the captured wind into the wind inlets 254, and increase the quantity of input wind. Through the fixed blades 256 recessed toward the inside of the housing 222 from the first surface 222a, the wind guided from the wind inlets 254 can be pressurized, so as to increase the pressure of the input wind. Hence, compared to the first embodiment or the second embodiment, the third embodiment provides the fan module 220 with the improved performance because the fan module 220 provided herein s equipped with the wind stoppers 252 and the fixed blades 256.

To sum up, in comparison with the conventional fan module, the fan module provided herein has at least the following advantages.

1. Given the same dimension and size, the fan module provided herein ensures high pressure of the input wind or large quantity of the input wind, so as to achieve favorable heat dissipation effects.

2. The wind leakage area can be sealed to reduce wind leakage.

3. Wind can enter the housing in a forward direction and can then be in contact with the fan blade assembly smoothly, so as to reduce the possibility of squeezing or distorting the input wind. As such, the fan blade assembly can push the wind with ease, and noise can be reduced.

4. The blades of the fan blade assembly can be improved, such that the area occupied by the blades from one end of the rotation axis to the other end remains the same. Compared to the conventional blades, the blades provided herein are enlarged and can push and move an increased quantity of input wind, so as to enhance the performance of the fan module.

5. The wind guiding structures located on the first surface of the housing strengthen the rigidity of the housing; hence, during the keyboard pressing test, the housing can protect the fan module from being squeezed and distorted and from generating abnormal sound.

6. The gap between the keyboard and the housing of the fan module can be reduced, such that the overall thickness of the electronic device can be reduced.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A fan module comprising:
    a housing having a first surface, and a plurality of wind guiding structures being located on the first surface;
    a fan blade assembly pivoted to the housing and adapted to rotate along a rotation direction; and
    a fan hub, the fan blade assembly being pivoted to the housing through the fan hub, wherein the wind guiding structures are arranged along a circumferential direction of the fan hub to guide a wind flow into the housing while the fan blade assembly is being rotated,
    wherein orthogonal projections of the wind guiding structures on a bottom of the housing are located within an orthogonal projection of the fan blade assembly on the bottom of the housing.

2. The fan module according to claim 1, wherein the wind guiding structures are arranged along a circumferential direction and disposed around at least one portion of the fan hub in a radiating manner.

3. The fan module according to claim 1, wherein the first surface has a fan hub opening, and the fan hub is located in the fan hub opening.

4. The fan module according to claim 3, wherein a diameter of the fan hub opening is greater than a diameter of the fan hub.

5. The fan module according to claim 1, wherein the wind guiding structures are protruding wind stopping openings, and each of the protruding wind stopping openings faces toward an upstream side of the rotation direction.

6. The fan module according to claim 5, wherein each of the protruding wind stopping openings has a wind stopper and a wind inlet, and the wind stopper protrudes from the first surface and is adjacent to the wind inlet.

7. The fan module according to claim 6, wherein for the each of the protruding wind stopping openings, the wind inlet is located at the upstream side along the rotation direction, and the wind stopper is located at a downstream side along the rotation direction.

8. The fan module according to claim 7, wherein each of the wind stoppers has a connection portion and a parallel portion parallel to the first surface, and the connection portion is connected between the parallel portion and the first surface.

9. The fan module according to claim 7, wherein the wind inlets are of a rectangular shape or an arc shape along a radial direction of the fan hub.

10. The fan module according to claim 1, wherein the wind guiding structures are recessed wind pressing openings, and each of the recessed wind pressing openings is recessed along the rotation direction toward an inside of the housing from the first surface.

11. The fan module according to claim 10, wherein the first surface has a wind entry area and a sealed area, the recessed wind pressing openings are arranged in the wind entry area, and the sealed area is sealed.

12. The fan module according to claim 10, wherein the recessed wind pressing openings comprise fixed blades and wind inlets, and the fixed blades are recessed toward the inside of the housing from the first surface.

13. The fan module according to claim 12, further comprising a plurality of protruding wind stopping openings disposed corresponding to the wind inlets of the recessed wind pressing openings.

14. The fan module according to claim 13, wherein each of the protruding wind stopping openings has a wind stopper, and each of the wind stoppers and each of the recessed wind pressing openings are located at two sides of a corresponding one of the wind inlets and share the corresponding one of the wind inlets.

15. The fan module according to claim 14, wherein each of the wind stoppers has a connection portion and a parallel portion parallel to the first surface, and the connection portion is connected between the parallel portion and the first surface.

16. The fan module according to claim 12, wherein the wind inlets are of a rectangular shape or an arc shape along a radial direction of the fan hub.

17. The fan module according to claim 10, wherein the first surface has a fan hub opening, the fan hub is located in the fan hub opening, and the housing further has an extension portion covering and sealing the fan hub opening.

18. The fan module according to claim 1, wherein the fan blade assembly comprises a rotation axis and blades, the fan hub and the rotation axis are fixed to each other, the blades are radially connected to the rotation axis along a circumference of the rotation axis, and each of the blades is of a rectangular shape.

19. An electronic apparatus, comprising:
 a chassis; and
 the fan module provided in claim 1 and installed in the chassis.

20. The electronic device according to claim 19, further comprising a display electrically connected to the chassis.

\* \* \* \* \*